US012604593B2

(12) United States Patent
Liu

(10) Patent No.: US 12,604,593 B2
(45) Date of Patent: Apr. 14, 2026

(54) LED STRUCTURE, LED DEVICE AND METHOD OF MANUFACTURING LED STRUCTURE

(71) Applicant: Enkris Semiconductor (Wuxi), Ltd., Wuxi (CN)

(72) Inventor: Weihua Liu, Wuxi (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 486 days.

(21) Appl. No.: 18/176,621

(22) Filed: Mar. 1, 2023

(65) Prior Publication Data

US 2023/0282685 A1      Sep. 7, 2023

(30) Foreign Application Priority Data

Mar. 2, 2022      (CN) .......................... 202210205169.5

(51) Int. Cl.
| | |
|---|---|
| *H10H 29/14* | (2025.01) |
| *H10H 20/01* | (2025.01) |
| *H10H 20/813* | (2025.01) |
| *H10H 20/815* | (2025.01) |
| *H10H 20/821* | (2025.01) |
| *H10H 20/851* | (2025.01) |

(52) U.S. Cl.
CPC .... *H10H 29/142* (2025.01); *H10H 20/01335* (2025.01); *H10H 20/813* (2025.01); *H10H 20/815* (2025.01); *H10H 20/821* (2025.01); *H10H 20/851* (2025.01)

(58) Field of Classification Search
CPC .................................................... H10H 20/813
See application file for complete search history.

(56) References Cited

U.S. PATENT DOCUMENTS

| | | | | |
|---|---|---|---|---|
| 8,735,867 | B2 * | 5/2014 | Seong .................. | H10H 20/811 |
| | | | | 257/14 |
| 2014/0363912 | A1 * | 12/2014 | Ohlsson .............. | H10H 20/811 |
| | | | | 438/34 |
| 2018/0332677 | A1 * | 11/2018 | Ku ........................ | H10H 20/821 |
| 2021/0249467 | A1 * | 8/2021 | He ......................... | H10H 29/14 |
| 2022/0085238 | A1 * | 3/2022 | Chudzik .............. | H10H 20/821 |

FOREIGN PATENT DOCUMENTS

KR           20140094093           *  7/2014

* cited by examiner

*Primary Examiner* — Matthew L Reames
(74) *Attorney, Agent, or Firm* — Westbridge IP LLC

(57) ABSTRACT

Disclosed are an LED structure, an LED device, and a manufacture method for the LED structure. The LED structure includes a substrate structure, and a first region and a second region are periodically provided in the substrate structure. The substrate structure includes a substrate and at least one patterned mask layer located on the substrate, the at least one patterned mask layer is located in the second region, and patterned mask layer in each second region are periodically provided. A light-emitting unit is located on the substrate structure, the light-emitting unit includes a first sub-light-emitting structure located in the first region and a second sub-light-emitting structure located in the second region, and light-emitting wavelengths of the first sub-light-emitting structure and the second sub-light-emitting structure are different. A light-emitting unit with two main light-emitting wavelengths is realized on a same substrate.

19 Claims, 5 Drawing Sheets

Providing a substrate — S100

Forming at least one patterned mask layer above a partial region of the at least one second region of the substrate — S200

Forming a light-emitting unit on the substrate structure through an epitaxial growth process — S300

LED STRUCTURE, LED DEVICE AND METHOD OF MANUFACTURING LED STRUCTURE

CROSS-REFERENCE TO RELATED APPLICATIONS

This application claims priority to Chinese Patent Application No. 202210205169.5, filed on Mar. 2, 2022, which is hereby incorporated by reference in its entirety.

TECHNICAL FIELD

This disclosure relates to the field of a light-emitting diode (LED) technology, and in particular, to an LED structure, an LED device and a method of manufacturing the LED structure.

BACKGROUND

At present, the mainstream technology of LED backlight is to realize white light LED through combining a blue light LED and phosphor.

Usually, the traditional methods for implementation of combining a blue light LED and phosphor include the following:

(1) A white light LED is realized by combining a blue light LED and yellow light phosphor. An LED backlight chip produced by this method has a problem of low color gamut, resulting in low color fidelity of the display device;

(2) A white light LED with higher color gamut performance can be realized by combining a blue light LED and green light phosphor and red light phosphor. However, the efficiency of blue light LED to trigger green light phosphor is low, and the production cost of green light phosphor is high.

Therefore, in order to solve the technical problem of the low color gamut of LED backlight chips, it is urgent to provide a new LED structure.

SUMMARY

The purpose of this disclosure is to provide an LED structure, an LED device and a method of manufacturing the LED structure, so as to solve the problem of low color gamut of LED backlight chips.

According to one aspect of this disclosure, an LED structure is provided. The LED structure includes a substrate structure and a light-emitting unit located on the substrate structure.

The substrate structure includes at least one first region and at least one second region.

The substrate structure includes a substrate and at least one mask layer located on the substrate, the at least one mask layer is located in the second region, the at least one mask layer in each second region is provided periodically.

The light-emitting unit includes a first sub-light-emitting structure located in the first region and a second sub-light-emitting structure located in the second region, light-emitting wavelengths of the first sub-light-emitting structure and the second sub-light-emitting structure are different.

Further, the light-emitting unit includes a first semiconductor layer, a light-emitting layer and a second semiconductor layer that are stacked in sequence; wherein, the light-emitting layer of the second sub-light-emitting structures includes an inclined structure.

Further, the light-emitting unit includes In element, and a content of In in the first sub-light-emitting structure is less than a content of In in the second sub-light-emitting structure.

Further, the at least one mask layer has a strip-shaped structure, and the at least one mask layer in each second region are provided in parallel and provided separately from each other.

Further, the at least one mask layer has a patterned structure, and a cross-sectional view of the mask layer includes any shape of a triangle, a circle or a square.

Furthermore, the at least one mask layer is made of insulating materials.

Further, an insertion layer is provided in the first semiconductor layer, and a conductivity type of the insertion layer is the same as a conductivity type of the first semiconductor layer.

Further, the LED structure further includes a stress modulation layer, and the stress modulation layer is located between the first semiconductor layer and the light-emitting layer.

Furthermore, the stress modulating layer has a superlattice structure including Group III-V compound materials.

Further, a thickness of the at least one mask layer is less than 2 $\mu$m.

Further, the LED structure further includes a buffer layer, and the buffer layer is located between the substrate structure and the light-emitting unit.

Further, the LED structure further includes a first electrode electrically connected to the first semiconductor layer, and a second electrode electrically connected to the second semiconductor layer.

Further, the at least one first region and the at least one second region are periodically provided.

Another aspect of this disclosure provides an LED device including the above-mentioned LED structure, a package substrate located on a side of the substrate structure away from the light-emitting unit and an encapsulation adhesive. The encapsulation adhesive covers an upper surface and sidewalls of the LED structure, and the encapsulation adhesive includes a phosphor material.

Further, a width of the LED structure is less than 100 $\mu$m.

Further, a width of the first region and/or the second region is less than 50 $\mu$m.

Further, a width of the at least one mask layer is less than 10 $\mu$m.

Further, a distance between the at least one mask layer in each second region is less than 10 $\mu$m.

In one aspect, the LED structure according to the embodiments of this disclosure realizes a light-emitting unit having two main light-emitting wavelengths on the same substrate; in another aspect, the LED device according to the embodiments of this disclosure provides an LED backlight chip that is prepared by encapsulating the light-emitting unit with two main light-emitting wavelengths and phosphors of different wavelengths, which effectively solves the problem of low color gamut of traditional LED backlight chips, simplifies the manufacturing steps of LED backlight chips, and reduces production cost of LED backlighting chips.

DETAILED DESCRIPTION OF THE EMBODIMENTS

Exemplary embodiments will be described in detail herein, examples of which are illustrated in the accompanying drawings. When the following description refers to the drawings, the same numerals in different drawings represent the same or similar elements unless otherwise indicated. The embodiments described in the following exemplary embodiments are not intended to represent all embodiments consistent with this disclosure. Rather, they are merely examples of means consistent with some aspects of this disclosure, as recited in the appended claims.

The terminology used in this disclosure is for the purpose of describing embodiments only and is not intended to limit this disclosure. Unless otherwise defined, technical or scientific terms used in this disclosure should have the ordinary meaning as understood by one of ordinary skill in the art to which this disclosure belongs. As used in this disclosure and in the claims, "first," "second," and similar terms do not denote any order, quantity, or importance, but are merely used to distinguish the various components. Likewise, "a" or "an" and the like do not denote a quantitative limitation, but rather denote the presence of at least one. "Plural" or "several" means two or more. Unless otherwise indicated, terms such as "front," "rear," "lower," and/or "upper" are for convenience of description and are not limited to one location or one spatial orientation. Words like "include" or "comprise" mean that the elements or objects appearing before "including" or "comprising" cover the elements or objects listed after "including" or "comprising" and their equivalents, and do not exclude other elements or objects. "Connected" or "associated" and similar words are not limited to physical or mechanical connections, but may include electrical connections, whether direct or indirect. As used in this disclosure and the appended claims, the singular forms "a", "the" and "said" are intended to include the plural forms as well, unless the context clearly dictates otherwise. It will also be understood that the term "and/or" as used herein refers to and includes any and all possible combinations of one or more of the associated listed items.

The First Embodiment

Figure 1:
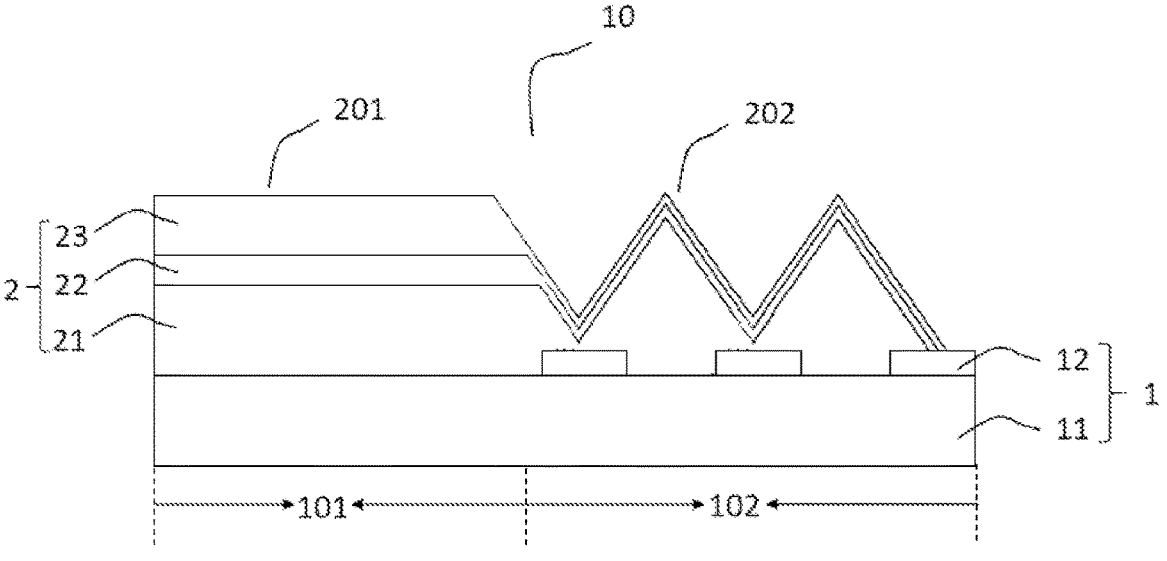
FIG. 1 is a schematic structural diagram according to a first embodiment of this disclosure.
Figure 7:
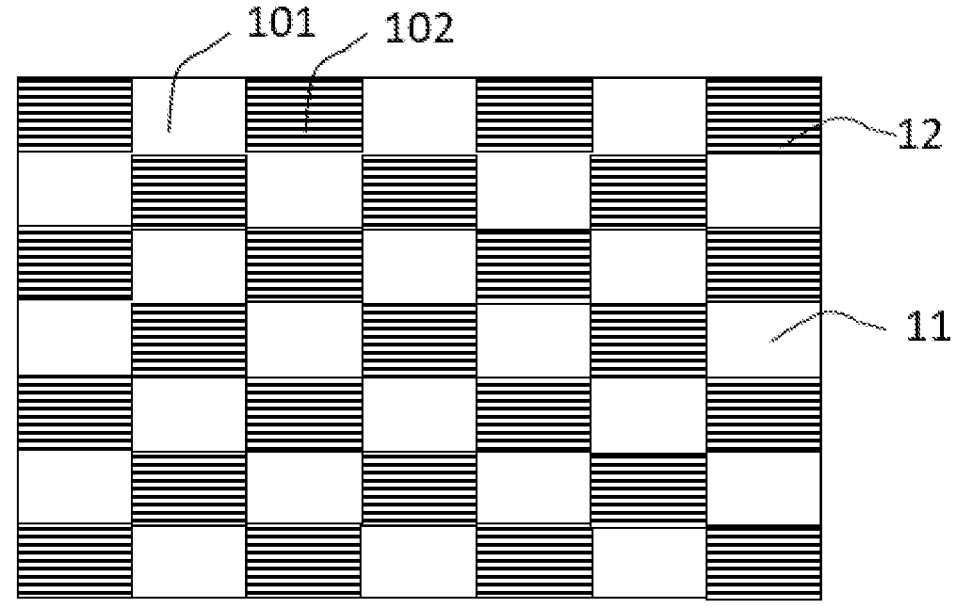
FIG. 7 is a top view of a substrate structure according to this disclosure.

FIG. 1 is a schematic structural diagram according to a first embodiment of this disclosure. FIG. 7 is a top view of a substrate structure. Referring to FIG. 1 and FIG. 7, this embodiment discloses an LED structure 10, which includes a substrate structure 1. FIG. 7 is a top view of the substrate structure 1. The substrate structure 1 is provided with first regions 101 and second regions 102, and the first regions

101 and the second regions 102 are periodically provided alternately. The substrate structure 1 includes a substrate 11 and at least one patterned mask layer 12 located on a partial region of one of the second regions 102 of the substrate 11. The at least one patterned mask layer 12 includes a plurality of patterns, the plurality of patterns are located in the second regions 102, and the plurality of patterns in each second region 102 are provided periodically. The LED structure 10 further includes light-emitting units 2 located on the substrate structure 1, and a light-emitting unit 2 includes a first sub-light-emitting structure 201 located in a first region 101 and a second sub-light-emitting structure 202 located in a second region 102. The first sub-light-emitting structure 201 and the second sub-light-emitting structure 202 have different light-emitting wavelengths.

The light-emitting unit 2 includes a first semiconductor layer 21, a light-emitting layer 22 and a second semiconductor layer 23 that are stacked in sequence. The light-emitting layer 22 in the second sub-light-emitting structure 202 includes an inclined structure. Preferably, the light-emitting layer 22 in the second sub-light-emitting structure 202 is entirely inclined structure.

The at least one patterned mask layer 12 is made of insulating materials, including dielectric layer materials such as $SiO_2$ or SiN. Preferably, the patterned mask layer 12 is made of $SiO_2$. Specifically, the at least one patterned mask layer 12 is used to suppress the epitaxial growth of the light-emitting unit 2 located above the at least one patterned mask layer 12, so that the first sub-light-emitting structure 201 and the second sub-light-emitting structure 202 formed through a same process have different light-emitting wavelengths. In this embodiment, the at least one patterned mask layer 12 is used to suppress the epitaxial growth of the first semiconductor layer 21 on the substrate 11 in the second region 102, so that an upper surface of the first semiconductor layer 21 epitaxially grown on the first region 101 is substantially parallel to an upper surface of the substrate 11. The first semiconductor layer 21 epitaxially grown on the second region 102 is gradually formed a three-dimensional epitaxial structure with inclined sidewalls along with the thickness increasing, and there is an angle between the outer surface of the inclined sidewalls and the upper surface of the substrate 11, specifically, the angle is an acute angle.

In this embodiment, the at least one patterned mask layer 12 is strip-shaped structures, and a plurality of patterned mask layers 12 in each second region 102 are provided in parallel and provided separately from each other. Of course, in other embodiments, the at least one patterned mask layer 12 may also be other structures, such as a grid structure with patterned mesh holes, the shape of the patterned mesh holes along the cross-section parallel to the upper surface of the substrate 11 is any shape such as a triangle, a circle, or a square. Depending on the different shapes of mesh holes, the second sub-light-emitting structure 202 grown in the mesh holes correspondingly (that is, a region in the second region 102 of the substrate 11 that is not covered by the at least one patterned mask layer 12) may be in the shape of a triangular pyramid, a cone, a pyramid, a truncated cone, or a pyramid, etc., which is not limited in disclosure. In the embodiment of this disclosure, a thickness of the patterned mask layer 12 is less than 2 μm.

The substrate 11 may include conventional semiconductor substrate materials such as Si, GaN, SiC, or sapphire. In this disclosure, the substrate 11 is selected to be made of sapphire substrate material, which is not limited herein.

The first semiconductor layer 21, the light-emitting layer 22 and the second semiconductor layer 23 are all made of Group III-V compounds, and the first semiconductor layer 21, the light-emitting layer 22 and the second semiconductor layer 23 may respectively include one or more materials of AlN, GaN, AlGaN or InGaN.

The conductivity types of the first semiconductor layer 21 and the second semiconductor layer 23 are opposite. Preferably, in the first embodiment of this disclosure, the first semiconductor layer 21 is an N-type doped semiconductor layer, and the second semiconductor layer 23 is a P-type doped semiconductor layer.

In this embodiment, the first semiconductor layer 21, the light-emitting layer 22, and the second semiconductor layer 23 each constitute a layer that continuously covers both the first regions 101 and the second regions 102, so as to ensure that portions of the first semiconductor layer 21 located in the first region 101 and the second region 102 are connected, so as to facilitate the subsequent simultaneous preparation of electrodes connected to the first semiconductor layers 21. In other embodiments, the portions of the first semiconductor layer 21 in the first region 101 and the second region 102 can also be isolated, and then electrodes for connecting the portions of the first semiconductor layer 21 in different regions are prepared respectively, which is not limited herein.

The light-emitting layer 22 includes In element. In the second region 102, during the epitaxial growth of the first semiconductor layer 21 on the substrate 11, since the epitaxial growth of the first semiconductor layer 21 on the substrate 11 covered by the at least one patterned mask layer 12 having the stripe structure has orientation, the epitaxial growth of the first semiconductor layer 21 along an A-axis direction of a lattice of a sapphire substrate is suppressed, the first semiconductor layer 21 grown on the second region 102 gradually forms a three-dimensional epitaxial structure with inclined sidewalls as the thickness increases. A cross-sectional shape of the semiconductor layer 21 perpendicular to the upper surface of the substrate 11 is a triangle or a trapezoid, preferably, the cross-sectional shape of the first semiconductor layer 21 perpendicular to the upper surface of the substrate 11 is a triangle. The light-emitting layer 22 and the second semiconductor layer 23 are conformally covering the surface of the inclined sidewalls of the first semiconductor layer 21 in sequence, forming inclined structures respectively. In one aspect, the setting of the at least one patterned mask layer 12 in the second region 102 makes the epitaxial growth of second sub-light-emitting structure 202 laterally, which reduces defects inside the second sub-light-emitting structure 202, thereby reducing a built-in stress of the second sub-light-emitting structure 202 and making a thickness of the light-emitting layer 22 in the second sub-light-emitting structure 202 thinner. Thus, the content of In of the light-emitting layer 22 in the second sub-light-emitting structure 202 is smaller than that of the light-emitting layer 22 in the first sub-light-emitting structure 201 and the emission wavelength of the light-emitting layer 22 in the corresponding first sub-light-emitting structure 201 is longer. In another aspect, because the built-in stress in the second sub-light-emitting structure 202 is relatively small, quantum confinement stark effect (QCSE) of second sub-light-emitting structure 202 is relatively small, thereby affecting its conduction band and valence band, widening the energy gap and widening the forbidden band width, which in turn makes the light-emitting wavelength of the light-emitting layer 22 in the second sub-light-emitting structure 202 shorter and realizes that the light-emitting unit 2 above the first region 101 and the light-emitting unit 2 above the second region 102 that is integrally formed on the same substrate through the same process have different light-emitting wavelengths, that is, the light-emitting unit 2 has light-emitting units with two main light-emitting wavelengths at the same time.

The Second Embodiment

Figure 2:
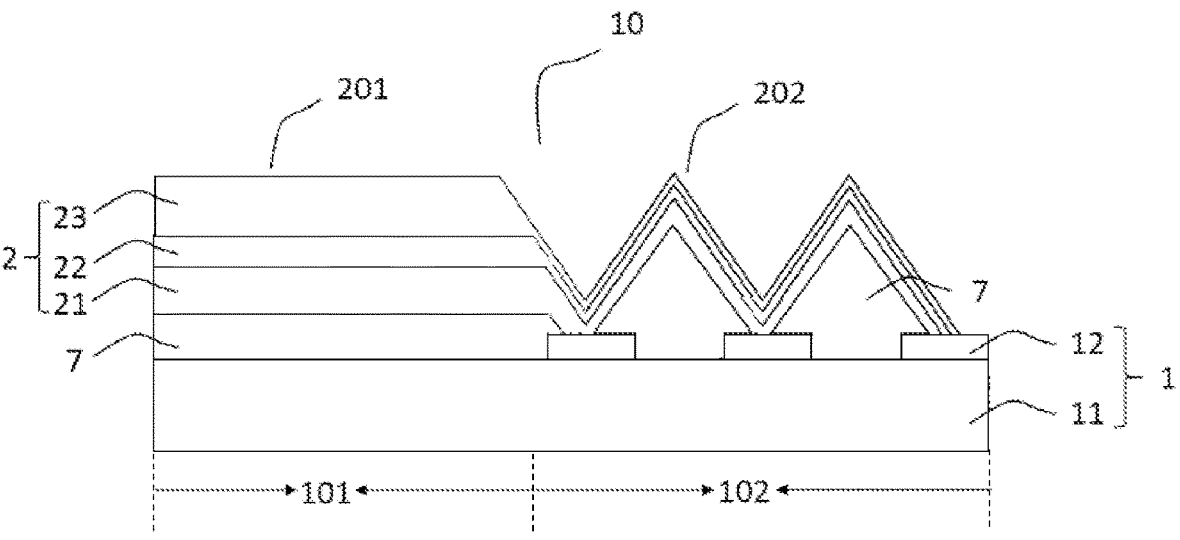
FIG. 2 is a schematic structural diagram according to a second embodiment of this disclosure.

FIG. 2 is a schematic structural diagram according to a second embodiment of this disclosure. Referring to FIG. 2, the structure of the second embodiment of this disclosure is substantially the same as the structure of the first embodiment, and the difference is only in that:

An LED structure 10 in this embodiment further includes a buffer layer 7, and the buffer layer 7 is located between the substrate structure 1 and a light-emitting unit 2. The material of the buffer layer 7 may be AlN. The arrangement of the buffer layer 7 effectively improves crystal quality of the light-emitting unit 2 and improves the light-emitting efficiency.

The buffer layer 7 grown on a second region 102 gradually forms a three-dimensional epitaxial structure with inclined sidewalls as the thickness increases, and a cross-sectional shape of the buffer layer 7 is a triangle or a trapezoid. Preferably, the cross-sectional shape of the buffer layer 7 is a triangle. A first semiconductor layer 21, a light-emitting layer 22 and a second semiconductor layer 23 conformally cover a surface of the buffer layer 7 in sequence. The buffer layer 7 in the second region 102 partially fills or completely fills the space between the patterned mask layer 12. As the thickness increases, the first semiconductor layer 21 gradually forms a three-dimensional epitaxial structure with inclined sidewalls, and the light-emitting layer 22 and the second semiconductor layer 23 conformally cover the surface of the first semiconductor layer 21 in sequence. The light-emitting layer 22 can conformally cover the surface of the first semiconductor layer 21 having the inclined sidewalls, which is not limited in this embodiment.

The Third Embodiment

Figure 3:
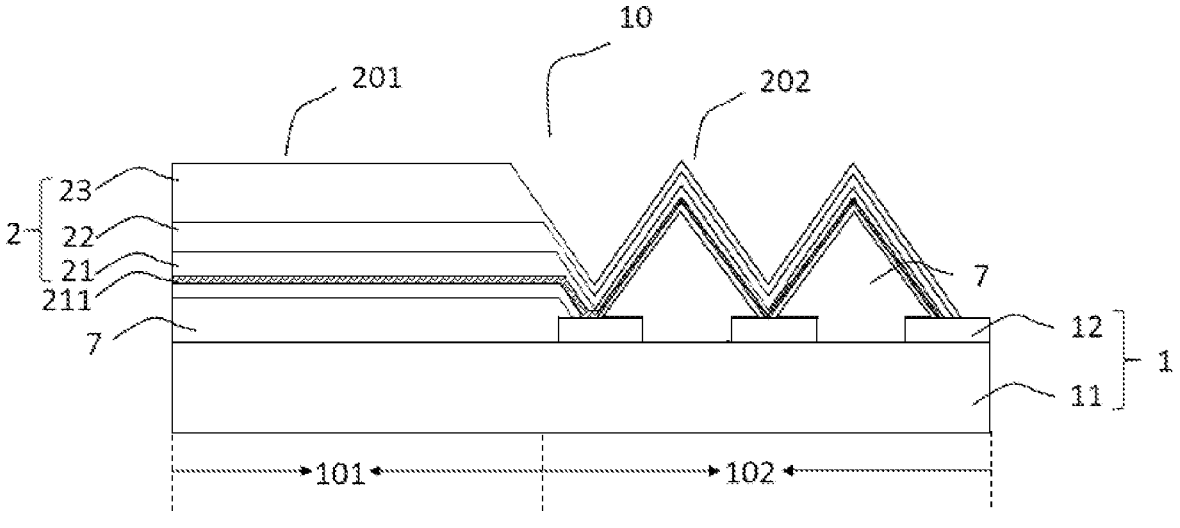
FIG. 3 is a schematic structural diagram according to a third embodiment of this disclosure.

FIG. 3 is a schematic structural diagram according to a third embodiment of this disclosure. Referring to FIG. 3, a structure of the third embodiment of this disclosure is substantially the same as that of the first embodiment or the second embodiment, and the difference is only that:

The LED structure 10 in this embodiment further includes an insertion layer 211, the insertion layer 211 is located in a first semiconductor layer 21.

The arrangement of the insertion layer 211 further expands the difference in the built-in stress between a first sub-light-emitting structure 201 and a second sub-light-emitting structure 202, so as to enlarge the difference in the light-emitting wavelengths between the first sub-light-emitting structure 201 and the second sub-light-emitting structure 202. Therefore, a light-emitting unit having two main light-emitting wavelengths on the same substrate is further realized.

The material of the insertion layer 211 is a Group III-V compound. In the embodiments of this disclosure, the material of the insertion layer 211 is AlGaN.

Preferably, the insertion layer 211 may be N-type doped. The doping element may be Si or Ge, which is not limited in this disclosure, as long as the insertion layer 211 can be formed with N-type doping.

The Fourth Embodiment

Figure 4:
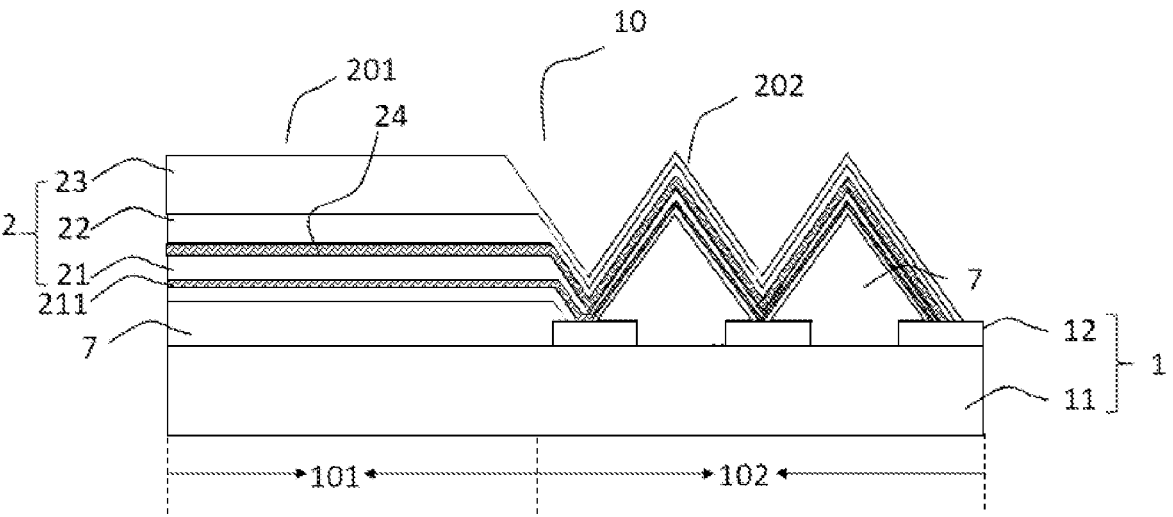
FIG. 4 is a schematic structural diagram according to a fourth embodiment of this disclosure.

FIG. 4 is a schematic structural diagram according to a fourth embodiment of this disclosure. Referring to FIG. 4, a structure of the fourth embodiment of this disclosure is substantially the same as the structure of any one of the first embodiment to the third embodiment, and the difference is only that:

An LED structure 10 in this embodiment further includes a stress modulation layer 24, and the stress modulation layer 24 is located between a first semiconductor layer 21 and a light-emitting layer 22.

The stress modulation layer 24 has a superlattice structure including Group III-V compound materials. In this embodiment, a minimum repeating unit of the superlattice structure in the stress modulation layer 24 may be a combination of InGaN and GaN or a combination of AlGaN and GaN.

The arrangement of the stress modulation layer 24 further expands the difference in the built-in stress between a first sub-light-emitting structure 201 and a second sub-light-emitting structure 202, so as to enlarge the difference between the light-emitting wavelengths of the first sub-light-emitting structure 201 and the second sub-light-emitting structure 202. Therefore, a light-emitting unit having two main light-emitting wavelengths on the same substrate is further realized.

The Fifth Embodiment

Figure 5:
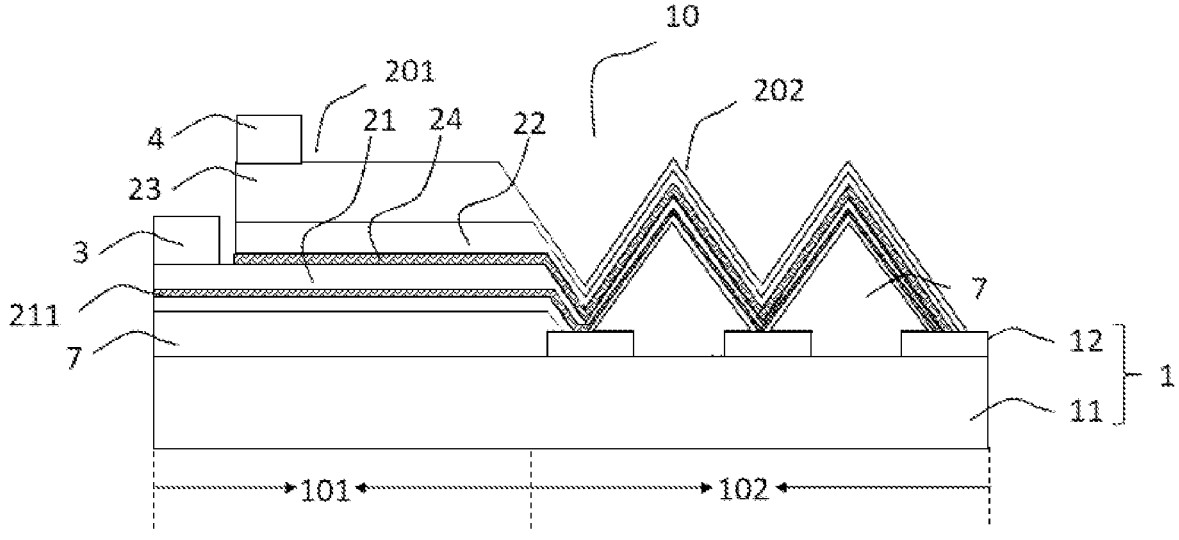
FIG. 5 is a schematic structural diagram according to a fifth embodiment of this disclosure.

FIG. 5 is a schematic structural diagram according to a fifth embodiment of this disclosure. Referring to FIG. 5, a structure of the fifth embodiment of this disclosure is substantially the same as that of any one of the first embodiment to the fourth embodiment, and the difference is only that:

An LED structure 10 in this embodiment further includes a first electrode 3 and a second electrode 4. The first electrode 3 is electrically connected to the first semiconductor layer 21, and the second electrode 4 is electrically connected to the second semiconductor layer 23. Further, the first electrode 3 and the second electrode 4 can be provided in a first region 101 and a second region 102 respectively to adjust a current density in different regions and further adjust the luminous efficiency in different regions of the LED structure 10.

The Sixth Embodiment

Figure 6:
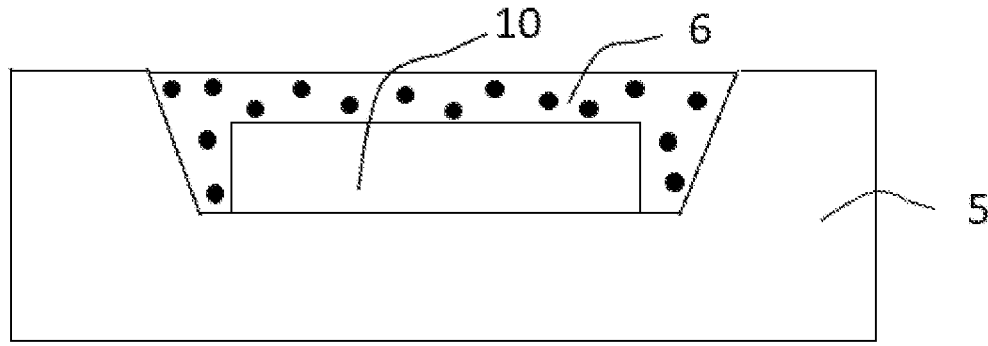
FIG. 6 is a schematic structural diagram according to a sixth embodiment of this disclosure.

FIG. 6 is a schematic structural diagram according to a sixth embodiment of this disclosure. Referring to FIG. 6, the sixth embodiment discloses an LED device, including an LED structure 10 disclosed in any one of the first embodiment to the fifth embodiment.

The LED device in the embodiment of this disclosure further includes an encapsulation substrate 5 and an encapsulation adhesive 6. The encapsulation substrate 5 is located on a side of a substrate structure 1 away from a light-emitting unit 2, the encapsulation adhesive 6 covers an upper surface and sidewalls of the LED structure 10, and the encapsulation adhesive 6 includes phosphor material.

Preferably, the light emitted by a first sub-light-emitting structure 201 in the LED structure 10 is green light, and the light emitted by a second sub-light-emitting structure 202 is blue light The encapsulation adhesive 6 includes silica gel and dispersed red light phosphor materials. The green light emitted by a part of the first sub-light-emitting structure 201 and the blue light emitted by a part of the second sub-light-emitting structure 202 excite the red light phosphor to emit red light. The generated red light and the blue and green light that have not been converted by the red phosphor are synthesized into white light. The LED device with such a structure effectively solves the problem of low color gamut of the traditional LED backlight chip, simplifies the manufacturing steps of the LED backlight chip, and reduces the manufacturing cost of the LED backlight chip.

As a preferred embodiment, in this embodiment, a width of the LED structure 10 is less than 100 μm, more preferably 20-100 μm. A width of a first region 101 and a width of a second region 102 are less than 50 μm, more preferably less than 20-50 μm. A width of patterns is less than 10 μm, and a distance between the patterns in each second region 102 is less than 10 μm.

The Seventh Embodiment

Figure 8:
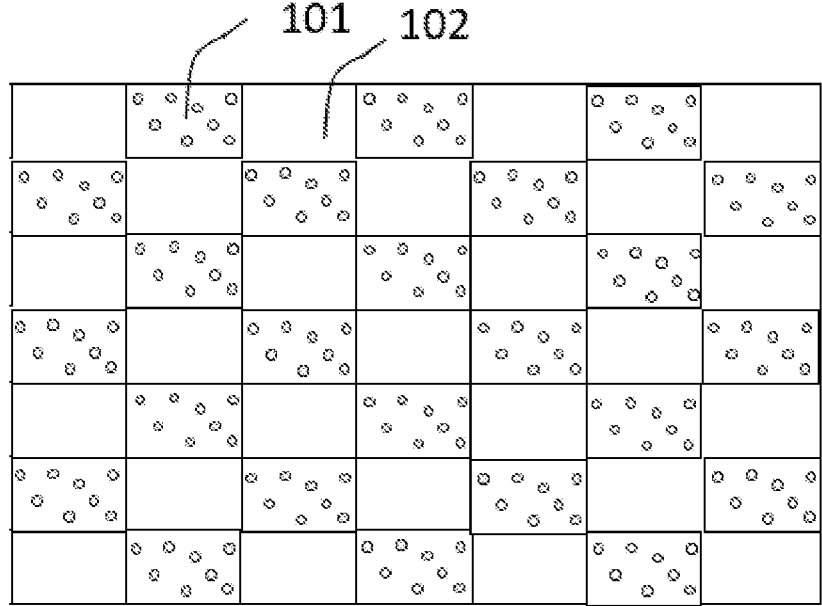
FIGS. 8 and 9 are top views according to a seventh embodiment of this disclosure.
Figure 9:
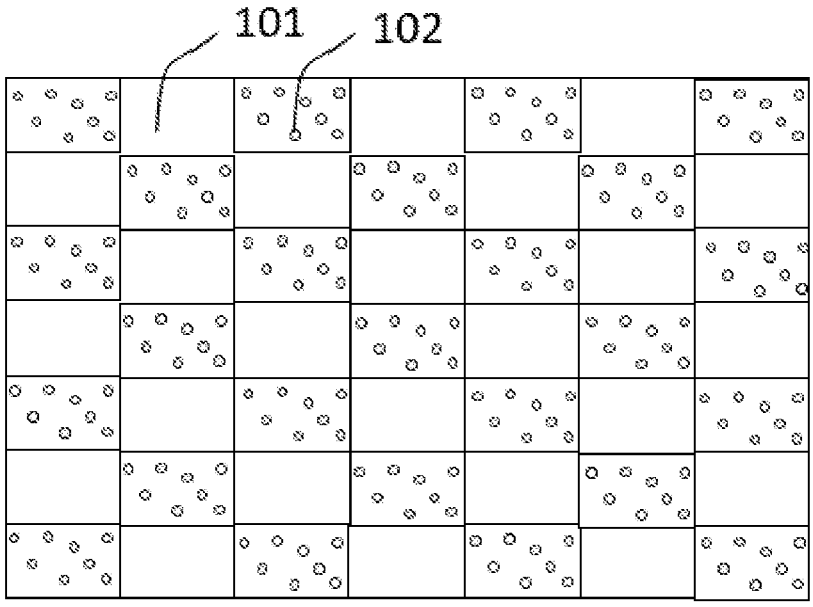

FIG. 8 and FIG. 9 are schematic structural diagrams according to a seventh embodiment of this disclosure. Referring to FIG. 8 and FIG. 9, an LED device of the seventh embodiment of this disclosure includes an LED structure 10 disclosed in any one of the first embodiment to the fifth embodiment. The structures of the LED device in the seventh embodiment of this disclosure and the LED device in the sixth embodiment are roughly the same. The difference is only that the arrangement of red light phosphor material in the encapsulation adhesive 6 corresponding to different regions are different. In this embodiment, the red phosphor material is only provided in encapsulation adhesive corresponding to a first region 101 or only in encapsulation adhesive corresponding to a second region 102. Further, in one implementation of this embodiment, as shown in FIG. 8, at least a partial region of the encapsulation adhesive 6 corresponding to the first region 101 that emits green light is provided with red light phosphor material, and the encapsulation adhesive 6 of the second region 102 that emits blue light is not provided with phosphor material. Preferably, scattered red light phosphors are provided in all regions of the encapsulation adhesive 6 corresponding to the first region 102. In other implementation of this embodiment, as shown in FIG. 9, at least a partial region of the encapsulation adhesive 6 corresponding to the first region 101 that emits green light doesn't contain phosphor material, and the encapsulation adhesive 6 corresponding to the second region 102 that emits blue light is provided with red light phosphors. Preferably, scattered red light phosphors are provided in all regions of the encapsulation adhesive 6 corresponding to the second region 102. In this way, only one wavelength of light can excite the red light phosphor material to emit red light, avoiding the interference of another wavelength of light on the excited red light phosphor, making the ratio of the light-emitting efficiency of blue light, green light and red light easy to adjust. The green light emitted by the first region 101, the blue light emitted by the second region 102, and the red light emitted by the excited red light phosphors synthesize white light. The LED device with such a structure effectively solves the problem that the color gamut of the traditional LED backlight chip is low, manufacturing steps of the LED backlight chip are simplified, and the manufacturing cost of the LED backlight chip is reduced.

In the related art, it is difficult to realize a light-emitting unit with two main light-emitting wavelengths on the same substrate at the same time, which needs to be realized by transferring light-emitting units with different light-emitting wavelengths to the same substrate. This method is complicated and has a high manufacturing cost. In this embodiment, the LED that emit blue light wavelength and green light wavelength at the same time are used, and red light phosphors are added to realize a white light LED with high color rendering index, which reduces the manufacturing cost of LED backlight chips.

The Eighth Embodiment

Figure 10:
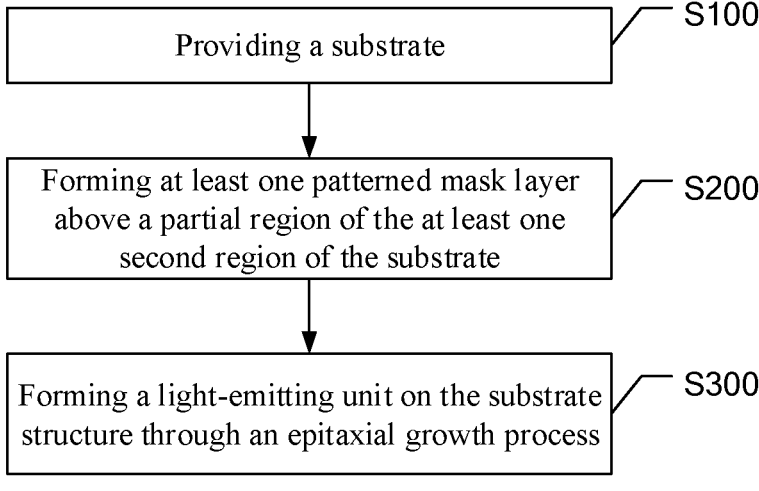
FIG. 10 is a schematic flowchart of a method of manufacturing an LED structure according to an eighth embodiment of this disclosure.

FIG. 10 is a schematic flowchart of a method of manufacturing an LED structure according to an eighth embodiment of this disclosure. Referring to FIG. 10, the eighth embodiment of this disclosure discloses the manufacture method for an LED structure, and the method includes the following steps.

Step S100: providing a substrate 11. The substrate 11 includes at least one first region 101 and at least one second region 102.

Step S200: forming at least one patterned mask layer 12 on a partial region of the second region 102 of the substrate 11 to form a substrate structure 1 including the substrate 11 and the patterned mask layer 12 on an upper surface of the substrate 11.

Step S300: forming a light-emitting unit 2 on the substrate structure 1 through an epitaxial growth process. The light-emitting unit 2 includes a first sub-light-emitting structure 201 formed over the first region 101 and a second sub-light-emitting structure 202 formed over the second region 102. The patterned mask layer 12 is used to suppress the epitaxial growth of the light-emitting unit 2 located above the patterned mask layer 12, so that the first sub-light-emitting structure 201 and the second sub-light-emitting structure 202 formed through the same process have different light-emitting wavelengths.

Specifically, firstly, a first semiconductor layer 21 is epitaxially grown on the substrate structure 1, then a light-emitting layer 22 is epitaxially grown on the first semiconductor layer 21, and finally a second semiconductor layer 23 is epitaxially grown on the light-emitting layer 22. Since the patterned mask layer 12 is provided in the second region 102, the patterned mask layer 12 suppresses the growth of the first semiconductor layer 21 in a specific direction, so that shapes of the first semiconductor layer 21 epitaxially grown on the first region 101 and the second region 102 of the substrate structure 1 are different. Specifically, the first semiconductor layer 21 on the first region 101 is layered, and an upper surface of the first semiconductor layer 21 on the first region 101 and the upper surface of the substrate 11 are substantially parallel. Depending on different shapes of the patterned mask layer 12, the shape of the first semiconductor layer 21 on the second region 102 may be a shape including inclined sidewalls such as a triangular pyramid, a cone, a pyramid, a truncated cone or a pyramid, etc. The light-emitting layer 22 is conformally formed on the sidewalls and the upper surface of the first semiconductor layer 21.

In this embodiment, the patterned mask layers are provided on the substrate, so that the first sub-light-emitting structure epitaxially grown on the first region where the mask layers are not provided and the second sub-light-emitting structure epitaxially grown on the second region where the mask layers are provided have different built-in stress, different shapes, different number of defects and different contents of In element, so that the first sub-light-emitting structure and the second sub-light-emitting structure have different conduction bands and different valence bands respectively, so that the emission wavelengths of the first sub-light-emitting structure and the second sub-light-emitting structure formed by the same process are different.

The technical problem of the low color gamut of the LED structure can be solved without increasing the production cost.

The above are only the preferred embodiments of this disclosure and do not limit this disclosure in any form. Although this disclosure has been disclosed as above in preferred embodiments, it is not intended to limit this disclosure. Those who has skill in the art can make some changes or modifications to equivalent embodiments of equivalent changes by using the technical content disclosed above without departing from the scope of the technical solutions of this disclosure. Any simple modifications, equivalent changes and modifications made to the above embodiments according to the technical essence of the present disclosure without departing from the content of the technical solutions of the present disclosure still fall within the scope of the technical solutions of the present disclosure.

What is claimed is:

1. A light-emitting diode (LED) structure, comprising:
a substrate structure, the substrate structure having at least one first region and at least one second region; the substrate structure comprising a substrate and at least one patterned mask layer which is located in a partial region in each of the at least one second region located on the substrate; and
a light-emitting unit located on the substrate structure, the light-emitting unit comprising a first sub-light-emitting structure located in the at least one first region and a second sub-light-emitting structure located in the at least one second region, and light-emitting wavelengths of the first sub-light-emitting structure and the second sub-light-emitting structure being different;
wherein the light-emitting unit comprises a first semiconductor layer, a light-emitting layer and a second semiconductor layer that are stacked in sequence, wherein the first semiconductor layer, the light-emitting layer, and the second semiconductor layer each constitute a layer that continuously covers both the first region and the second region;
wherein the first semiconductor layer in the second region is a three-dimensional epitaxial structure with inclined sidewalls, and the light-emitting layer of the second sub-light-emitting structure is an inclined structure formed by conformally covering the inclined sidewalls of the first semiconductor layer.

2. The LED structure according to claim 1, wherein the light-emitting unit comprises In element, and a content of In in the first sub-light-emitting structure is different from a content of In in the second sub-light-emitting structure.

3. The LED structure according to claim 1, wherein one of the at least one patterned mask layer comprises a plurality of patterns, and the plurality of patterns in each of the at least one second region are provided periodically and separately from each other.

4. The LED structure according to claim 3, wherein a shape of an orthographic projection of the patterns on the at least one second region is any one of a rectangle, a triangle, a circle or a square.

5. The LED structure according to claim 1, wherein the at least one patterned mask layer is made of insulating materials.

6. The LED structure according to claim 1, wherein the light-emitting unit further comprises an insertion layer located in the first semiconductor layer, wherein a conductivity type of the insertion layer is the same as a conductivity type of the first semiconductor layer, and wherein a material of the insertion layer is AlGaN.

7. The LED structure according to claim 1, wherein the LED structure further comprises a stress modulation layer, and the stress modulation layer is located between the first semiconductor layer and the light-emitting layer, wherein the stress modulation layer has a superlattice structure comprising Group III-V compound materials, and wherein the stress modulation layer is configured to enlarge a difference in built-in stress between the first sub-light-emitting structure and the second sub-light-emitting structure.

8. The LED structure according to claim 7, wherein a minimum repeating unit of the superlattice structure is selected from a combination of InGaN/GaN or AlGaN/GaN.

9. The LED structure according to claim 1, wherein a thickness of the at least one patterned mask layer is less than 2 μm.

10. The LED structure according to claim 1, wherein one of the at least one patterned mask layer is a grid structure with a plurality of mesh holes, and the plurality of mesh holes above each of the at least one second region are provided periodically and provided separately from each other, a shape of an orthographic projection of the mesh holes on the at least one second region is any one of a rectangle, a triangle, a circle or a square.

11. The LED structure according to claim 1, wherein the light-emitting unit is an epitaxial structure formed on the substrate structure through an epitaxial growth process.

12. The LED structure according to claim 11, wherein the at least one patterned mask layer is used for suppressing epitaxial growth of the first semiconductor layer of the light-emitting unit located above the at least one patterned mask layer, so that the first semiconductor layer epitaxially grown in the second region is formed as the three-dimensional epitaxial structure with inclined sidewalls, and the first sub-light-emitting structure and the second sub-light-emitting structure formed through a same process have different light-emitting wavelengths.

13. The LED structure according to claim 1, wherein the at least one first region comprises a plurality of first regions, and the at least one second region comprises a plurality of second regions, wherein the plurality of first regions and the plurality of second regions are periodically and alternately provided.

14. An LED device, comprising:
   the LED structure according to claim 1;
   a package substrate located on a side of the substrate structure away from the light-emitting unit; and
   an encapsulation adhesive, the encapsulation adhesive covering an upper surface and sidewalls of the LED structure, at least a partial region of the encapsulation adhesive comprising a phosphor material.

15. The LED device according to claim 14, wherein a width of the LED structure is less than 100 μm.

16. The LED device according to claim 14, wherein a width of the at least one first region is less than 50 μm; and a width of the at least one second region is less than 50 μm.

17. The LED device according to claim 14, wherein one of the at least one patterned mask layer comprises a plurality of patterns, and the plurality of patterns above each of the at least one second region are provided periodically and provided separately from each other; a width of one of the plurality of patterns is less than 10 μm; and a distance between the plurality of patterns in each of the at least one second region is less than 10 μm.

18. The LED device according to claim 14, wherein light emitted by the light-emitting unit in the LED structure located in the at least one first region is green light, and light emitted by the light-emitting unit located in the at least one second region is blue light; wherein the phosphor material is a red light phosphor material.

19. A manufacturing method for an LED structure, comprising:
   providing a substrate, the substrate comprising at least one first region and at least one second region;
   forming at least one patterned mask layer over a partial region of the at least one second region of the substrate to form a substrate structure comprising the substrate and the at least one patterned mask layer located on an upper surface of the substrate; and
   forming a light-emitting unit on the substrate structure through an epitaxial growth process, the light-emitting unit comprising a first sub-light-emitting structure formed over the at least one first region and a second sub-light-emitting structure formed over the at least one second region; wherein the light-emitting unit comprises a first semiconductor layer, a light-emitting layer and a second semiconductor layer that are stacked in sequence, wherein the first semiconductor layer, the light-emitting layer, and the second semiconductor layer each constitute a layer that continuously covers both the first region and the second region;
   wherein the at least one patterned mask layer is configured to suppress epitaxial growth of the light-emitting unit located above the at least one patterned mask layer, such that the first semiconductor layer epitaxially grown in the second region is formed as a three-dimensional epitaxial structure with inclined sidewalls, and the light-emitting layer of the second sub-light-emitting structure conformally covers the inclined sidewalls of the first semiconductor layer to form an inclined structure, so that the first sub-light-emitting structure and the second sub-light-emitting structure formed through a same process have different light-emitting wavelengths.

* * * * *